United States Patent
Terano et al.

(10) Patent No.: US 8,896,027 B2
(45) Date of Patent: Nov. 25, 2014

(54) NITRIDE SEMICONDUCTOR DIODE

(71) Applicant: Hitachi, Ltd., Tokyo (JP)

(72) Inventors: Akihisa Terano, Hachioji (JP);
Kazuhiro Mochizuki, Tokyo (JP);
Tomonobu Tsuchiya, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 68 days.

(21) Appl. No.: 13/684,508

(22) Filed: Nov. 24, 2012

(65) Prior Publication Data
US 2013/0134443 A1 May 30, 2013

(30) Foreign Application Priority Data

Nov. 30, 2011 (JP) ................. 2011-262557

(51) Int. Cl.
H01L 29/66 (2006.01)
H01L 29/205 (2006.01)
H01L 29/872 (2006.01)
H01L 29/16 (2006.01)
H01L 29/207 (2006.01)
H01L 29/06 (2006.01)
H01L 29/20 (2006.01)
H01L 29/47 (2006.01)

(52) U.S. Cl.
CPC ............ *H01L 29/205* (2013.01); *H01L 29/872* (2013.01); *H01L 29/0692* (2013.01); *H01L 29/66212* (2013.01); *H01L 29/1608* (2013.01); *H01L 29/207* (2013.01); *H01L 29/2003* (2013.01); *H01L 29/475* (2013.01)
USPC ..................... 257/194; 257/183; 257/E21.403

(58) Field of Classification Search
CPC .............. H01L 29/205; H01L 29/2003; H01L 29/1608; H01L 29/0692; H01L 29/872

USPC ............ 257/194, 183, 94, E21.403, E29.327, 257/E29.246
See application file for complete search history.

(56) References Cited

U.S. PATENT DOCUMENTS

| 5,441,901 | A | * | 8/1995 | Candelaria | 438/317 |
| 6,770,917 | B2 | * | 8/2004 | Barthelmess et al. | 257/104 |
| 8,237,198 | B2 | * | 8/2012 | Wu et al. | 257/194 |
| 2006/0108659 | A1 | * | 5/2006 | Yanagihara et al. | 257/471 |
| 2009/0114948 | A1 | | 5/2009 | Ishida | |
| 2009/0283776 | A1 | * | 11/2009 | Iwamuro | 257/76 |
| 2010/0207166 | A1 | * | 8/2010 | Zhu | 257/201 |
| 2012/0223319 | A1 | * | 9/2012 | Dora | 257/76 |

FOREIGN PATENT DOCUMENTS

JP 2009-117485 A 5/2009

OTHER PUBLICATIONS

T. Ueda et al., "Polarization Engineering in GaN Power Transistors", Phys. Status Solidi B 247, No. 7, 2010, pp. 1735-1739.

* cited by examiner

Primary Examiner — Cuong Q Nguyen
Assistant Examiner — Yosef Gebreyesus
(74) Attorney, Agent, or Firm — Miles & Stockbridge P.C.

(57) ABSTRACT

Disclosed is a high performance nitride semiconductor having a reverse leak current characteristic with two-dimensional electron gas as a conductive layer. A desired impurity is diffused into or a nitride semiconductor to which a desired impurity is added is re-grown on the bottom surface and the side face portion of a recessed portion formed by dry etching using chlorine gas on the upper surface of a nitride semiconductor stacked film to increase resistance of the side face portion of the nitride semiconductor stacked film contacting an anode electrode, reducing the reverse leak current.

10 Claims, 11 Drawing Sheets

FIG. 10

| DIFFUSION IMPURITY | HEAT TREATMENT CONDITION | | REVERSE DIRECTION CHARACTERISTIC | |
|---|---|---|---|---|
| | ATMOSPHERE | TEMPERATURE (°C) | BREAKDOWN VOLTAGE | REVERSE LEAK CURRENT (A/mm) |
| Zn | $N_2$ | 600 | >1kV | $2.7\sim3.6\times10^{-5}$ |
| | | 700 | ← | $5.1\sim6.3\times10^{-5}$ |
| | | 800 | ← | $7.6\sim8.9\times10^{-5}$ |
| | REDUCED PRESSURE 100Pa | 600 | ← | $0.9\sim1.2\times10^{-5}$ |
| | | 700 | ← | $2.0\sim3.5\times10^{-5}$ |
| | | 800 | ← | $5.2\sim6.5\times10^{-5}$ |
| Mg | $N_2$ | 600 | ← | $2.4\sim3.5\times10^{-5}$ |
| | | 700 | ← | $4.2\sim5.6\times10^{-5}$ |
| | | 800 | ← | $7.5\sim8.7\times10^{-5}$ |
| | REDUCED PRESSURE 100Pa | 600 | ← | $0.8\sim0.9\times10^{-5}$ |
| | | 700 | | $1.8\sim2.9\times10^{-5}$ |
| | | 800 | | $4.7\sim6.0\times10^{-5}$ |

NITRIDE SEMICONDUCTOR DIODE

CLAIM OF PRIORITY

The present application claims priority from Japanese patent application JP 2011-262557 filed on Nov. 30, 2011, the content of which is hereby incorporated by reference into this application.

FIELD OF THE INVENTION

The present invention relates to a nitride semiconductor diode and in particular to a technique effectively applied to a nitride semiconductor diode which takes as a conductive layer two-dimensional electron gas (2DEG) generated by heterojunction when nitride semiconductor layers different in band gap energy are stacked one on top of another and includes an anode electrode performing Schottky barrier junction with the side face of stacked film of the nitride semiconductor diode.

BACKGROUND OF THE INVENTION

In recent years, an electronic device using a wide gap semiconductor such as silicon carbide (SiC) and gallium nitride (GaN) has been vigorously developed to apply it to power electronics.

As a device using a nitride semiconductor typified by gallium nitride (GaN), a horizontal device using a non-doped AlGaN/GaN heterojunction, for example, has been vigorously developed.

This is characterized in that a conductive layer formed of a non-doped, but two-dimensional electron gas (hereinafter abbreviated to 2DEG) is generated on the GaN side near a junction interface by the influence of a large band offset, a natural polarization generated on a heterojunction interface, and a strong piezopolarization.

Since the 2DEG conductive layer has a high electron mobility and a high electron concentration (approximately $10^{13}$ cm$^{-2}$), a high electron mobility transistor (HEMT) device using an AlGaN/GaN heterostructure has been mounted on a DC-DC converter circuit for power electronics and commercialized in recent years.

A horizontal diode using the heterostructure has also been developed on assumption that it is applied to power electronics. An attempt to increase current density per unit area viewed from the upper has been made such that the heterostructure is multi-layered to improve a forward direction characteristic, stacking a plurality of conductive layers made of the 2DEG in the vertical direction (in the perpendicular direction with respect to the principal plane of a substrate).

Japanese Unexamined Patent Application Publication No. 2009-117485 discusses a horizontal diode having a multi-layered heterojunction in which anode and cathode electrodes are formed at the side face portion of the heterojunction to lower an access resistance to a 2DEG conductive layer positioned in the lower layer.

"Phys. Status Solid B 247, No. 7, 2010, T. Ueda et al." discusses a technique in which anode and cathode electrodes are formed at the side face portion of a three-layered 2DEG conductive layer in the recess structure to obtain an on-resistance of 52 mΩcm$^2$ and a reverse breakdown voltage of 9400V.

SUMMARY OF THE INVENTION

The formation of the electrodes at the side face portion of the 2DEG conductive layer discussed in Japanese Unexamined Patent Application Publication No. 2009-117485 and "Phys. Status Solid B 247, No. 7, 2010, T. Ueda et al." is a effective method in terms of increasing a forward-direction current density in a nitride semiconductor horizontal diode with a plurality of the 2DEG conductive layers as a drift layer.

When an anode (Schottky) electrode is formed at the side face of the 2DEG conductive layer, a stacked film made of a plurality of nitride semiconductors different in band gap energy such as GaN and AlGaN epitaxially grown on a substrate is prepared. An region excluding the drift layer of the stacked film is processed and removed using a dry etching method using chlorine gas, for example, to form a recessed portion for exposing the side face of the stacked film including the 2DEG conductive layer and the heterojunction portion, forming the anode (Schottky) electrode contacting the side face including the heterojunction portion exposed on the recessed portion. Thereafter, a cathode (ohmic) electrode is formed on the side face of the stacked film inside the other recessed portion formed on the side opposite to the recessed portion beyond the stacked film to complete the horizontal diode.

The horizontal diode formed by the above process has a problem that a reverse leak current is large, a desired withstand-voltage characteristic cannot be obtained, and the performance of the nitride semiconductor diode is lowered.

The purpose of the present invention is to improve the performance of the nitride semiconductor diode.

The above objects and novel features of the present invention will become apparent from the description of the present specification and the accompanying drawings.

According to one aspect of the present invention, a nitride semiconductor diode includes a substrate, a heterojunction stacked film on which a first nitride semiconductor layer formed on the substrate and a second nitride semiconductor layer greater in band gap energy than the first nitride semiconductor layer are stacked, a cathode electrode ohmically connected with the side face of the stacked film, and an anode electrode, in which the stacked film is provided with a recessed portion which reaches the depth of a heterojunction surface being the interface of the first and second nitride semiconductor layers, the recessed portion is provided with an region where at least one type of impurity selected from among a group of carbon (C), iron (Fe), zinc (Zn), and magnesium (Mg) is implanted, and the anode electrode contacts the region and is Schottky connected with the stacked film.

According to the aspect of the present invention, the performance of the nitride semiconductor diode can be improved.

BRIEF DESCRIPTION OF THE DRAWINGS

FIG. 10 shows a table indicating a maximum p-type impurity density, a p-type impurity diffusion depth, a maximum oxygen density, a reverse leak current, and a breakdown voltage with respect to heat treatment condition for diffusing Zn or Mg into the nitride semiconductor layer;

DETAILED DESCRIPTION OF THE PREFERRED EMBODIMENTS

Figure 1:
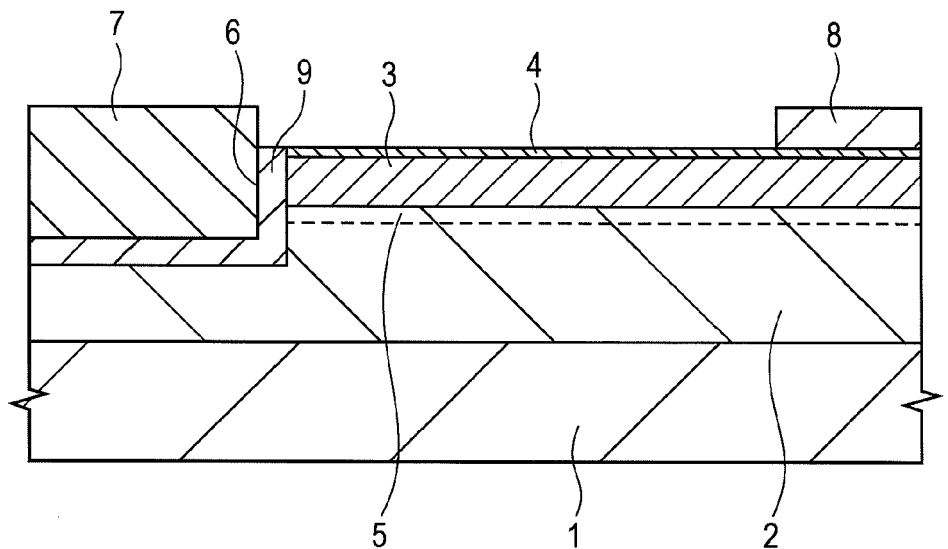
FIG. 1 is a cross section of a nitride semiconductor diode according to a first embodiment of the present invention.

An embodiment of the present invention is described in detail below with reference to the accompanying drawings. In all drawings for describing the embodiment, members similar in function are given the same reference numerals and characters and the repetitive description thereof is omitted. In the following embodiments, unless otherwise required, the description of the same or the similar portion is not repeated in principle.

In the drawings used in the following embodiments, partial hatching is sometimes provided for even a top view for the sake of easy understanding.

First Embodiment

The results of experiments conducted by the inventors are described below. The authors produced two types of experimental horizontal diodes having structures illustrated in FIGS. 11 and 12 using an epitaxial substrate with an AlGaN/GaN single heterostructure and compared and evaluated reverse characteristics of both horizontal diodes to obtain knowledge about the reverse characteristics of the horizontal diodes described in Japanese Unexamined Patent Application Publication No. 2009-117485 and "Phys. Status Solid B 247, No. 7, 2010, T. Ueda et al." The term recessed structure refers to the structure of an element including an electrode provided inside a recessed portion formed on the surface of the substrate.

Figure 11:
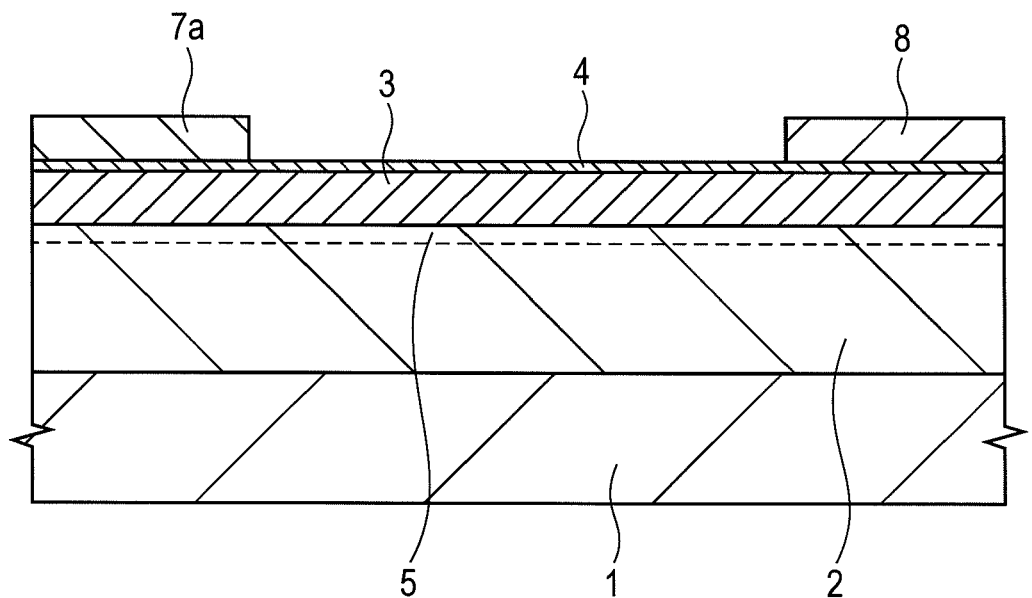
FIG. 11 shows a cross section of a planer structure horizontal diode as a comparison example.
Figure 12:
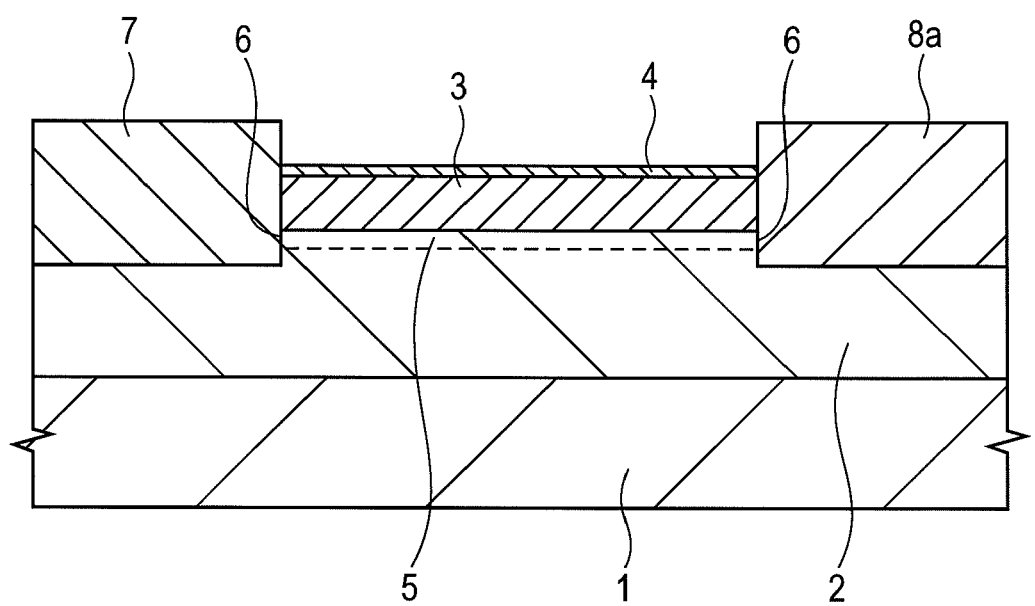
FIG. 12 shows a cross section of a recessed structure horizontal diode as a comparison example.

As shown in the cross sections of FIGS. 11 and 12, the epitaxial structure of the diode in an comparison example includes a 3.0 μm thick high-resistance buffer layer 2 formed of GaN on a sapphire substrate 1, a 25 nm thick barrier layer 3 formed of undoped AlGaN, and a 5 nm thick cap layer 4 formed of undoped GaN. The barrier layer 3 is formed on the high-resistance buffer layer 2 formed of GaN and the cap layer 4 is formed on the barrier layer 3.

The high-resistance buffer layer 2 and the barrier layer 3 have heterojunction and a conductive layer 5 made of the two-dimensional electron gas exists in the high-resistance buffer layer 2 including an interface thereof.

The conductive layer 5 is formed such that the two-dimensional electron gas diffuses into the direction along the heterojunction interface in the high-resistance buffer layer 2 including the vicinity of the upper portion of the high-resistance buffer layer 2 of the heterojunction portion. In the heterojunction portion made of a first nitride semiconductor layer small in band gap and a second nitride semiconductor layer larger in band gap than the first nitride semiconductor layer thereabove, the two-dimensional electron gas shows a state where a large amount of electrons formed in such a manner as to extend flat in the vicinity of the upper portion in the first nitride semiconductor layer is accumulated. When a Schottky barrier diode is operated, current flows from the anode electrode to the cathode electrode in the conductive layer 5.

The two types of experimental horizontal diodes being comparison examples are described below with reference to FIGS. 11 and 12.

FIG. 11 shows a cross section of a planer-structure horizontal diode which forms an anode electrode 7a being a Schottky electrode and a cathode electrode 8 being an ohmic electrode only on the surface of the epitaxial layer. In FIG. 11, the epitaxial layer in the region where the electrodes are provided is not subjected to dry etching using chlorine gas.

FIG. 12 shows a recess-structure horizontal diode formed such that a part of the upper surface of the epitaxial layer is subjected to dry etching using chlorine gas and recessed portions 6 sandwiching the stacked film therebetween are formed so as to expose the side faces of the stacked film of the nitride semiconductor including the side face of the conductive layer 5 made of the two-dimensional electron gas, thereafter, an anode electrode 7 is formed in one recessed portion 6 and a cathode electrode 8a is formed in the other recessed portion 6 to bring the electrodes into contact with the side faces of the stacked film.

In the structure shown in FIGS. 11 and 12, the anode electrodes 7 and 7a are 300 nm thick electrodes of palladium (Pd) and the cathodes 8 and 8a are electrodes of Ti/Al. In other words, the cathode 8 has a stack structure in which aluminum (Al) film is formed on a titan (Ti) film. FIG. 12 also shows a contour of the bottom of the conductive layer 5 by a broken line as is the case with FIG. 11.

Figure 13:
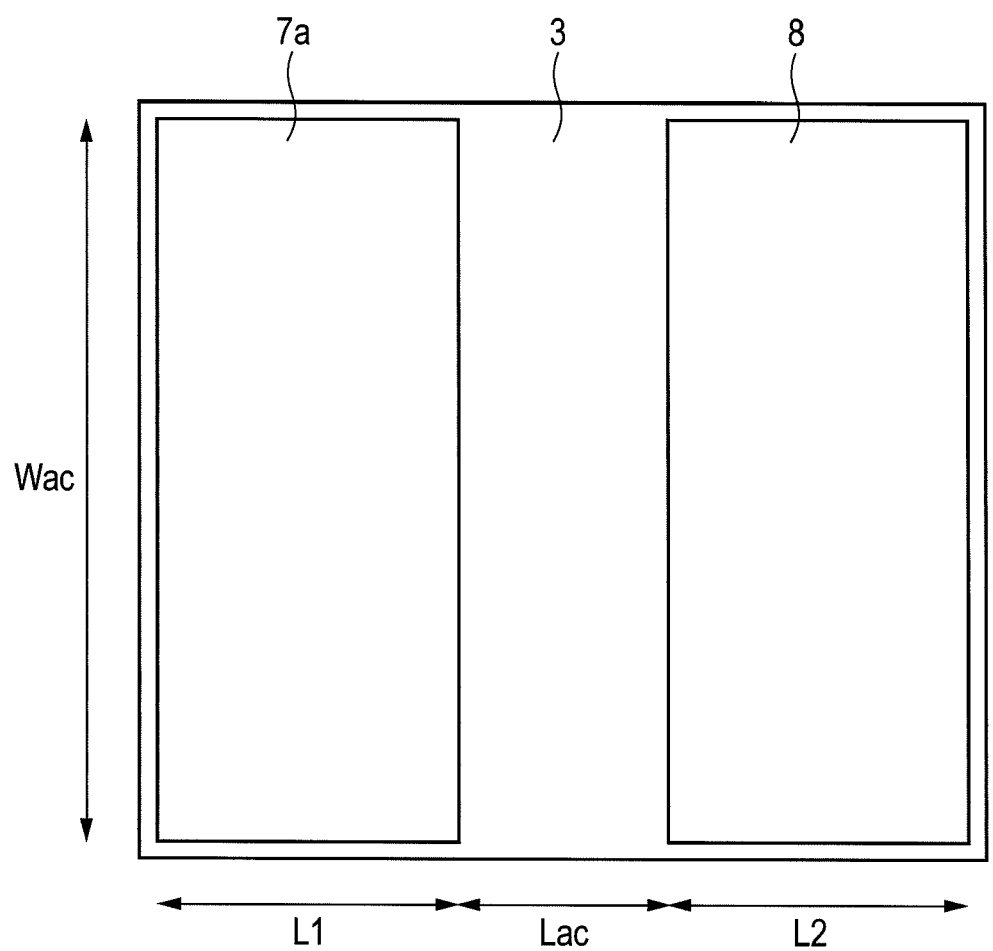
FIG. 13 shows a plane view of the planer structure horizontal diode as a comparison example.

FIG. 13 shows a plane view of the diode shown in FIG. 11. A plane view of FIG. 12 is similar in structure to that of FIG. 13. FIG. 13 shows the anode electrode 7a, the cathode 8, and the barrier layer 3, but does not show the cap layer 4 (FIG. 11) formed on the barrier layer 3. The dimensions of the anode electrode 7a and the cathode 8 are 300 μm×1.0 mm as shown in the plane view in FIG. 13. In other words, the longitudinal length Wac is 1.0 mm and lengths L1 and L2 orthogonal to the longitudinal direction are 300 μm. Thus, the anode electrode 7a and the cathode 8 which extend in the longitudinal direction are arranged side by side in the direction orthogonal to the longitudinal direction. In the plane view, the barrier layer 3 is formed to surround the periphery of the anode electrode 7a and the cathode 8. The length Lac between the anode electrode 7a and the cathode 8 is 150 μm.

Figure 14:
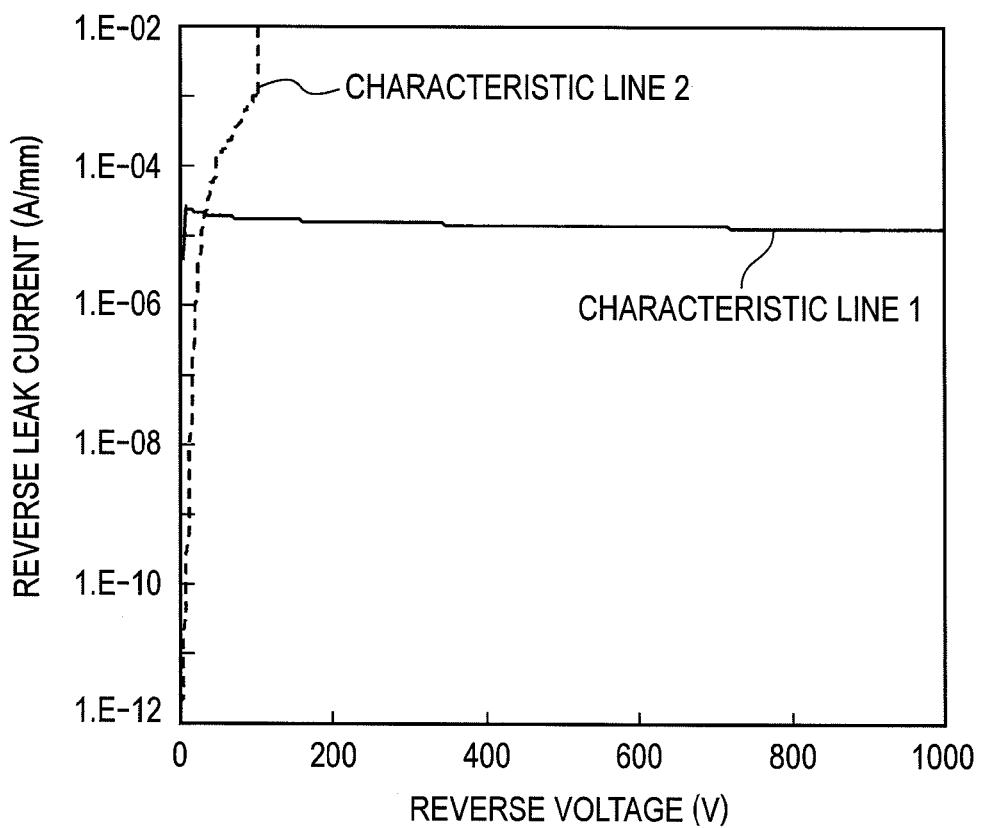
FIG. 14 is a graph showing the reverse-direction characteristic of the recessed and the planer structure horizontal diode in the comparison example.

FIG. 14 shows the results of experiment for evaluating the reverse-direction characteristic of the experimental horizontal diode in the comparison example.

As shown in FIG. 14, the planer-structure diode (refer to FIG. 11) shown by a characteristic line 1 (solid line) was not broken down even when the reverse voltage of 1 kV or higher is applied to the diode and the reverse current was an almost constant value of 1 to $2\times10^{-5}$ A/mm at a reverse voltage of up to 1 kV.

On the other hand, the recess-structure diode (refer to FIG. 12) shown by a characteristic line 2 (broken line) increased in leak current along with increase in the reverse voltage and was broken down at the reverse voltage of 100 V.

The experiment results showed that the recess-structure horizontal diode in which the anode electrode 7a and the cathode 8 are formed on the side face of the heterojunction exposed by the dry etching using chlorine gas was very inferior in the reverse-direction characteristic to the planer-structure diode which is not subjected to dry etching.

The inventors conducted an experiment using a vertical Schottky barrier diode to examine the influence of the dry etching using chlorine gas on the nitride semiconductor.

Figure 15:
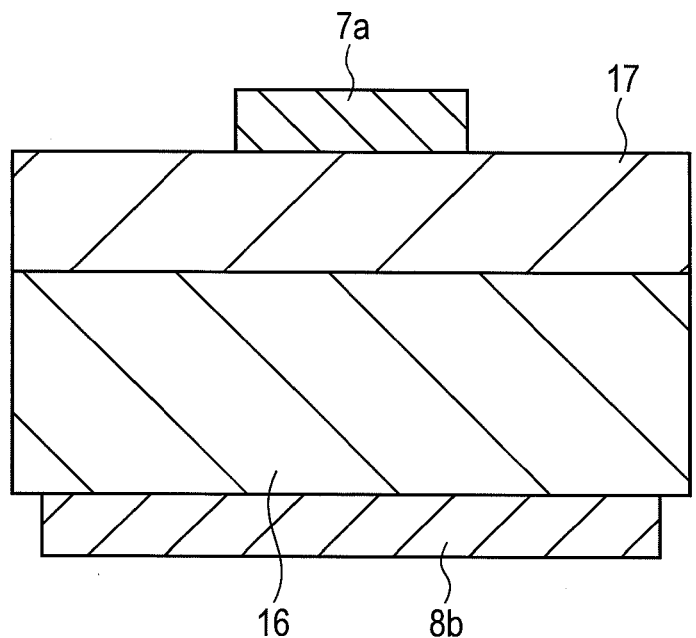
FIG. 15 shows a cross section of a vertical diode as a comparison example.

As shown in FIG. 15, the experiment used a substrate on which a low-density n-type GaN layer 17 with a Si doping density of $2\times10^{16}$ cm$^{-3}$ and a thickness of 12 μm is epitaxially grown on an n-type GaN substrate 16.

A Ti/Al electrode acting as a cathode (ohmic) electrode 8b is provided on the other side of the n-type GaN substrate 16. The 300 nm thick anode (Schottky) electrode 7a of palladium (Pd) (an electrode size of 300 μmφ) is provided on the surface of the low-density n-type GaN layer 17.

In the experiment, there were produced two types of vertical diodes including a diode (A) in which the upper surface of the low-density n-type GaN layer 17 is subjected to the dry etching using chlorine gas and a diode (B) in which the anode electrode 7 is formed on the surface of the low-density n-type GaN layer 17 epitaxially grown without performing the dry etching as a process before the anode electrode 7a is formed. The amount of etching of the dry etching is taken as 100 nm.

Figure 16:
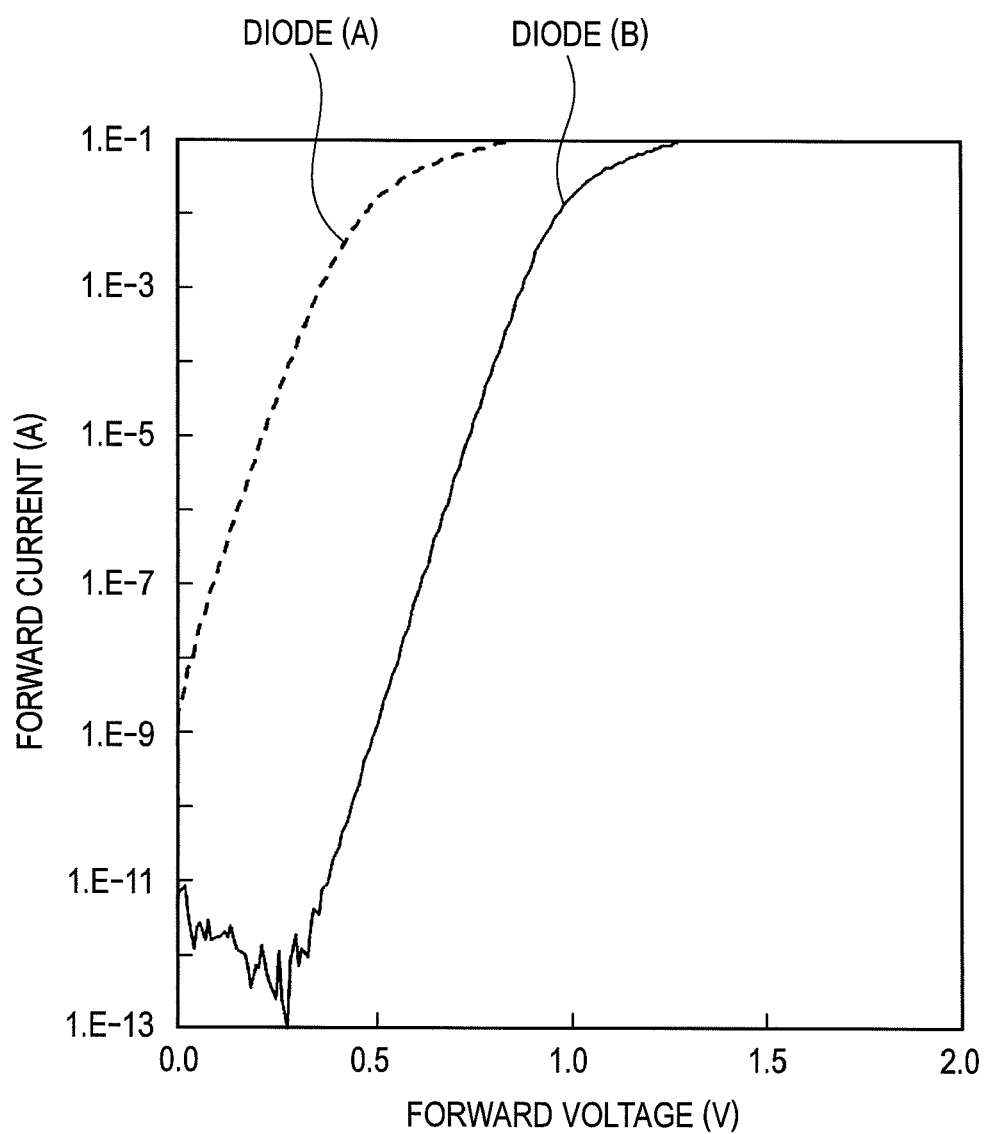
FIG. 16 is a graph showing the forward direction characteristic of the vertical diode.
Figure 17:
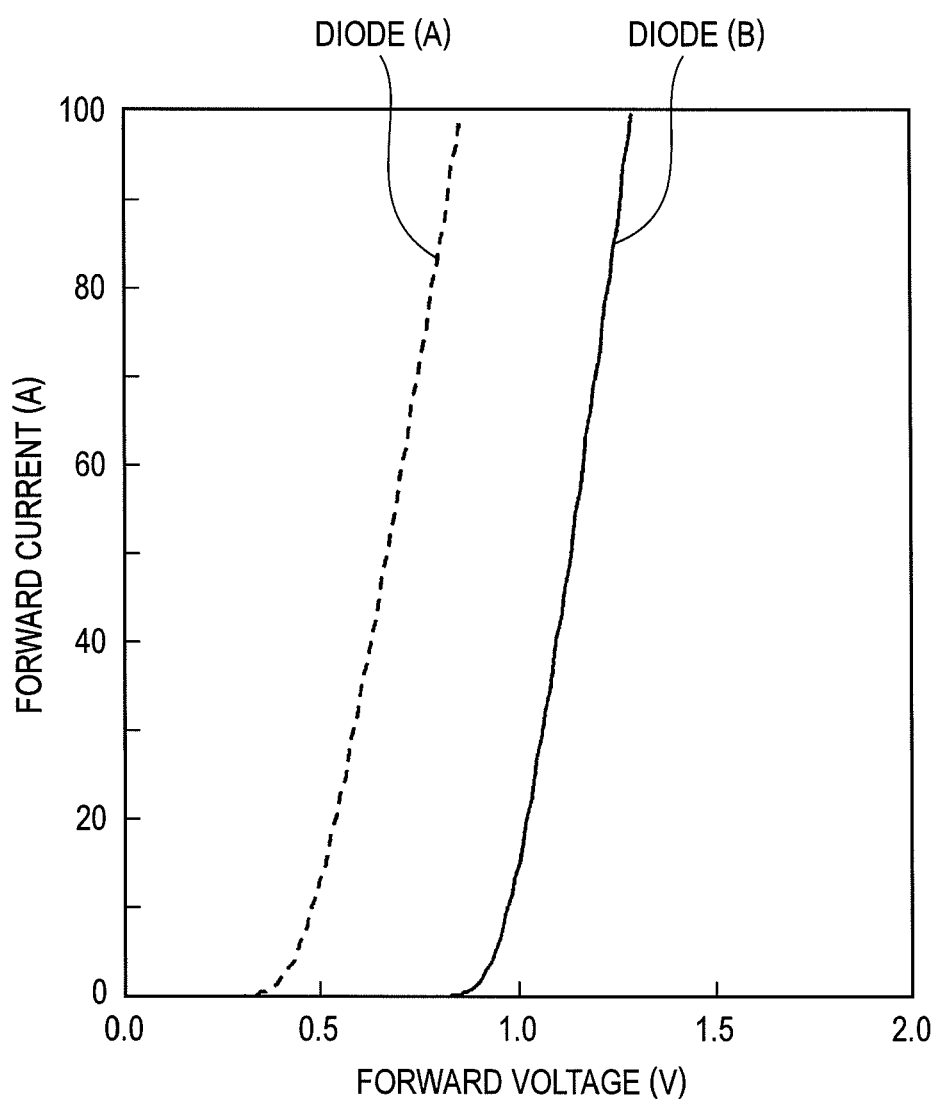
FIG. 17 is a graph showing the forward direction characteristic of the vertical diode.

FIGS. 16 and 17 show the results of evaluation of the forward-direction characteristic of the vertical diode being the comparison example shown in FIG. 15. Graphs shown in FIGS. 16 and 17 indicate a forward-direction voltage on the abscissa and a forward-direction current on the ordinate.

According to the results shown in FIG. 16, it was observed that the diode (A) subjected to the dry etching was shifted by about 0.5 V to a lower voltage side in a rise of current at a micro-current region with respect to the diode (B) which was not subjected to the dry etching, the diode (B) was about 1.2 eV in Schottky barrier height φb and the diode (A) was lowered to about 0.65 eV in Schottky barrier height φb. However, n-value representing a quality of Schottky junction of the diode (B) was about 1.02, but that of the diode (A) was about 1.07 almost equal to the above value, therefore, deterioration of the Schottky junction itself due to the dry etching was not observed.

According to the results shown in FIG. 17, the diode (A) was shifted by about 0.5 V to a lower voltage side in a rising voltage of the current with respect to the diode (B) as is the case with FIG. 16, but difference was not found in the gradient of current indicating an element resistance.

In view of the above experimental results, as shown in FIG. 17, a difference is not found in the gradient of current after the rise indicating an element resistance as the influence of the dry etching using chlorine gas on the nitride semiconductor, from which it is estimated that the surface of the nitride semiconductor exposed by the etching is not increased in resistance.

As shown in a graph of FIG. 16, a good n-value shows that physical or chemical damage to the surface of the nitride semiconductor is small and a comparatively clean surface of the nitride semiconductor is kept maintained. However, it is estimated from decrease in Schottky barrier height φb that a donor (carrier) occurs in the topmost surface layer of the nitride semiconductor exposed to the etching to decrease the resistance of the topmost surface layer.

It is presumed that deterioration in the reverse-direction characteristic of the recess-structure horizontal diode results from not obtaining a sufficient reverse-direction withstand voltage because the surface of the nitride semiconductor which the anode electrode contacts lowers in resistance by the influence of a donor (carrier) occurring in the topmost surface layer of the nitride semiconductor exposed by the etching to lower the Schottky barrier height φb between the anode electrode and the nitride semiconductor, increasing leak current from the anode (Schottky) electrode.

For the horizontal diode with the two-dimensional electron gas (2DEG) as the conductive layer, n-type impurities are not particularly added to the conductive layer, so that the reverse-direction characteristic normally shows a tendency that a certain leak current changes with respect to the reverse-direction voltage, as shown in the planer type.

To cope with this event, the inventors found that the above reverse-direction characteristic was improved by compensating the donors (carriers) on the surface subjected to the dry etching, in a horizontal diode which uses the two-dimensional electron gas (2DEG) conductive layer occurring on the heterojunction interface of a nitride-semiconductor stacked film different in band gap such as GaN and AlGaN as a drift layer and includes an electrode connected by the Schottky junction with the side face of the stacked film exposed by processing and removing the stacked film using a known dry etching method.

Therefore, it is preferable to realize a structure whose reverse-direction characteristic shows a tendency similar to that of the planer type even if an anode (Schottky) electrode is formed on the side face of the recessed portion formed by the dry etching using chlorine gas.

The inventors made investigation and found the following in a horizontal diode which uses the 2DEG conductive layer occurring on the heterojunction interface of nitride-semiconductor stacked film different in band gap such as GaN and AlGaN as a drift layer and includes an electrode connected by the Schottky junction with the side face of the nitride semiconductor stacked film including the side face of the conductive layer made of the two-dimensional electron gas exposed by processing and removing a desired region of the nitride semiconductor stacked film using a known dry etching method. More specifically, the inventors found that the targeted reverse-direction characteristic of the horizontal diode was realized by compensating the donors (carriers) on the surface subjected to the dry etching such that (1) a semi-insulating or high resistance nitride semiconductor layer is re-grown on and (2) p-type impurities are diffused to the region, or the side face thereof, where an anode electrode is formed on the recessed portion of the nitride semiconductor stacked film subjected to the dry etching.

Embodiments and effects of the present invention are described below with reference to the accompanying drawings.

The structure of the nitride semiconductor diode according to the embodiment of the present invention is described. FIG. 1 is a cross section of a nitride semiconductor diode according to the embodiment of the present invention.

The nitride semiconductor diode shown in FIG. 1 is similar in epitaxial structure to those shown in FIGS. 11 and 12 for the sake of easy comparison with the nitride semiconductor diode being a comparison example and the dimension and arrangement of each electrode are the same as those shown in FIG. 13. The nitride semiconductor diode shown in FIG. 1 includes an anode electrode 7 formed in a recessed portion 6 as is the case with the structure shown in FIG. 12 and a cathode electrode 8 formed on the stacked film as is the case with the structure shown in FIG. 11. The cathode electrode 8 and the anode electrode 7 are separated from each other. The depth of the recessed portion 6 is approximately 50 nm, for example, from the upper surface of the stacked film.

As shown in FIG. 1, the recessed portion 6 provided at the region where the anode electrode 7 is formed and being a characteristic of the present embodiment is formed by dry etching using chlorine gas. A re-grown layer (epitaxial growth layer) 9 made of GaN to which carbon (C) being an impurity is added is formed on the bottom surface and the side face of the recessed portion 6. A high-resistance buffer layer 2, a barrier layer 3, and a cap layer 4 are formed on a substrate 1 one on top of the other, the anode electrode 7 is formed in the recessed portion 6 formed by etching the upper surface of a stacked film made of the high-resistance buffer layer 2, the barrier layer 3, and the cap layer 4, and re-growth layer 9 is formed between the anode electrode 7 and the stacked film. In FIG. 1, the contour of bottom of a conductive layer 5 is indicated by a broken line.

The cathode electrode 8 is formed not on the side face of the recessed portion formed by etching, unlike the anode electrode 7, but on a plane. This is because the cathode electrode 8 can obtain a sufficiently low ohmic contact with the conductive layer without the recess structure if the conductive layer 5 being the two-dimensional electron gas layer is a single layer.

In processes from the formation of the recessed portion in the region where the anode electrode is formed using chlorine gas to the formation of the anode electrode, the recessed portion 6 is formed only in the region where the anode electrode is formed by the dry etching using chlorine gas with the $SiO_2$ film as a mask and then a 20 nm thick re-grown layer 9 made of GaN to which carbon (C) is added is re-grown (epitaxially grown) on the bottom surface and the side face of the recessed portion with the $SiO_2$ film as a mask. At this point, re-growth layer 9 made of GaN is not grown on the $SiO_2$ film, so that re-growth layer 9 is selectively grown and formed on the inner wall and the bottom portion where the surface of the nitride semiconductor is exposed.

As a method for adding carbon (C) to an epitaxial layer in the crystal growth of a nitride semiconductor, there is known a method for reducing a growth pressure at that time using a known metal-organic vapor phase epitaxy (MOVPE) growth method, for example. In using the MOVPE growth method, the growth pressure is controlled to allow easily adjusting the density of adding carbon (C). The re-growth pressure in forming the re-growth layer 9 in the nitride semiconductor diode according to the present embodiment is 50 kPa and the density of C in the re-growth layer 9 made of GaN is $4 \times 10^{16}$ cm$^{-3}$.

Thereafter, the anode electrode 7 made of palladium (Pd) is formed to be completely buried in the recessed portion 6 on which the re-growth layer 9 made of GaN to which carbon (C) is added is grown, thereby the anode electrode forming process is completed. The anode electrode 7 can be formed by liftoff, for example. The anode electrode 7 may have a stack structure in which a gold (Au) film is formed on a nickel (Ni) film, for example.

As a result of evaluating the reverse-direction characteristic of the horizontal diode, of the present invention, which is completed by forming the cathode electrode 8 on a desired plane portion, the horizontal diode was not broken down even when a reverse voltage of 1 kV is applied thereto and kept a substantially constant reverse leak-current value as is the case with the planer structure diode. The leak current level at this point ranged from $6.0 \times 10^{-6}$ A/mm to $7.0 \times 10^{-6}$ A/mm. The leak current was more decreased than that of the planer structure diode.

This is probably because the donors (carriers) occurring at the surface exposed by the dry-etching are compensated by the synergistic effect between the high resistance characteristic of the GaN layer to which carbon (C) is added as an impurity and a heat of 1000° C. or higher applied to the substrate at the time of re-growth, the heterojunction side face is protected in an appropriated state by the GaN layer to which carbon (C) is added, and the structure is changed to one in which the anode electrode does not directly contact the side face of the stacked film including the conductive layer made of the two-dimensional electron gas. Since impurities such as carbon (C) are added to increase the resistance of the stacked film in the vicinity of the recessed portion, the density of the impurity in the stacked film in the vicinity of the anode electrode is increased rather than in the vicinity of the cathode electrode.

Thus, in the nitride semiconductor diode provided with the anode electrode being Schottky-connected to the side face of the stacked film including the heterojunction exposed by processing by the dry etching, the nitride semiconductor diode according to the present embodiment is smaller in reverse leak current and higher in withstand-voltage characteristic than the Schottky barrier diode to which impurities such as carbon (C) are not added. This can improve the performance of the nitride semiconductor diode.

The embodiment of the nitride semiconductor diode is described in which the horizontal diode similar to the above one was produced by forming the re-growth layer 9 being the GaN layer to which iron (Fe) is added as an impurity instead of carbon (C). The density of Fe in the re-growth layer 9 is $5 \times 10^{17}$ cm$^{-3}$ and the thickness of the re-growth layer 9 is 100 nm. Other than the impurity added to the re-grown GaN layer (re-growth layer), the density, and the thickness, the structure is similar to that shown in FIG. 1.

As a result of evaluating the reverse-direction characteristic of the horizontal diode which was completed by forming the re-growth layer 9 to which iron (Fe) is added as described above, as is the case with the planer type, the structure in which iron (Fe) is introduced was not broken down even in a case where the reverse voltage of up to 1 kV was applied and the leak current was as low as 8.0 to $9.0 \times 10^{-7}$ A/mm.

An embodiment of a nitride semiconductor diode is described below in a case where an impurity added to the above re-growth layer 9 is replaced with magnesium (Mg) instead of carbon (C) and iron (Fe). At this point, the density of Mg in the re-growth layer 9 is $1 \times 10^{17}$ cm$^{-3}$ and the thickness of the re-growth layer 9 is 50 nm. In this case, other than the impurity added to the re-grown GaN layer (re-growth layer), the density, and the thickness, the structure of the nitride semiconductor diode is also similar to that shown in FIG. 1.

As a result of evaluating the reverse-direction characteristic of the completed horizontal diode according to the present invention, the structure in which magnesium (Mg) is added to the re-growth layer 9 was not broken down in a case where the reverse voltage of up to 1 kV was applied but the leak current showed an unstable value.

More specifically, at a first reverse-voltage application, the leak current varied from $3.0 \times 10^{-5}$ A/mm to $9.0 \times 10^{-6}$ A/mm. At a second and the subsequent reverse-voltage application, however, the leak current was stable in the range from $8.0 \times 10^{-6}$ A/mm to $9.0 \times 10^{-6}$ A/mm.

This seems to result from a high density of hydrogen included in the GaN layer (re-growth layer) to which magnesium (Mg) is added. In other words, it is presumed that heat generated by the first reverse-voltage application causes phenomenon in which hydrogen included in the GaN layer to which Mg is added is moved and desorbed in the semiconductor to make the leak current unstable, but the hydrogen at the second and the subsequent application is already desorbed to make the leak current stable.

Concerning that, the inventors performed heat treatment at a temperature of 700° C. for 30 minutes in a nitrogen atmosphere after the Mg-addition GaN layer was re-grown, formed the anode electrode, thereafter, produced and evaluated the diode. As a result, the inventors confirmed that variation in the reverse leak current was not observed.

The three elements of C, Fe, and Mg added to the re-growth layer are already known in the field of a nitride semiconductor crystal growth technique, so that the elements are easily applicable materials in terms of a production method. In the nitride semiconductor diode according to the present embodiment, a nitride semiconductor layer to which the impurity selected from among the three elements of the above C, Fe, and Mg is added is re-grown on the side face of the heterojuncture exposed in the recessed portion formed by the dry etching on the nitride semiconductor to decrease the leak current from the anode electrode, enabling improving the reverse withstand-voltage of the diode comparable to that of the planer structure.

According to the investigation of the inventors, it is preferable that the density of an impurity to be added is $4\times10^{16}$ $cm^{-3}$ or more if C or Fe is added and $1\times10^{17}$ $cm^{-3}$ or more if Mg is added as an impurity. If each impurity is added at the density lower than the above density values and the re-growth layer is formed, neither the re-growth layer sufficient high in intrinsic degree nor the re-growth layer having a low-density and high resistance p-type conductive layer can be obtained, which causes a problem that the side wall of the stacked film to be Schottky-connected is turned to an n-type one to lower the reverse withstand voltage of the Schottky barrier diode or increase the reverse leak current.

Since the nitride semiconductor layer (re-growth layer) to which the impurity is added is high in resistance, a needlessly thick nitride semiconductor layer becomes a resistance component in the forward direction to increase an element resistance. According to the investigation of the inventors, the thickness of the re-growth layer is desirably 150 nm or less, and is more preferably 100 nm or less.

In other words, only the existence of the re-growth layer as thin as 1 nm in thickness can more significantly improve the reverse-direction characteristic than the case where the re-growth layer does not exist.

Although the present embodiment uses GaN as the re-growth layer, the GaN does not necessarily need to be used. AlGaN, InAlN, InAlGaN, or InGaN may be used. Because the 2DEG may be generated between the re-growth layer and the side portion of the nitride semiconductor surface exposed on the recessed portion if the nitride semiconductor material greater in band gap energy than the GaN is used, it is desirable that a material for the re-growth layer is not very greater in band gap energy than the GaN.

If a material except the GaN is selected, a selective epitaxial growth cannot be made to increase a process for removing an unnecessary re-growth layer after re-growth.

Second Embodiment

Figure 2:
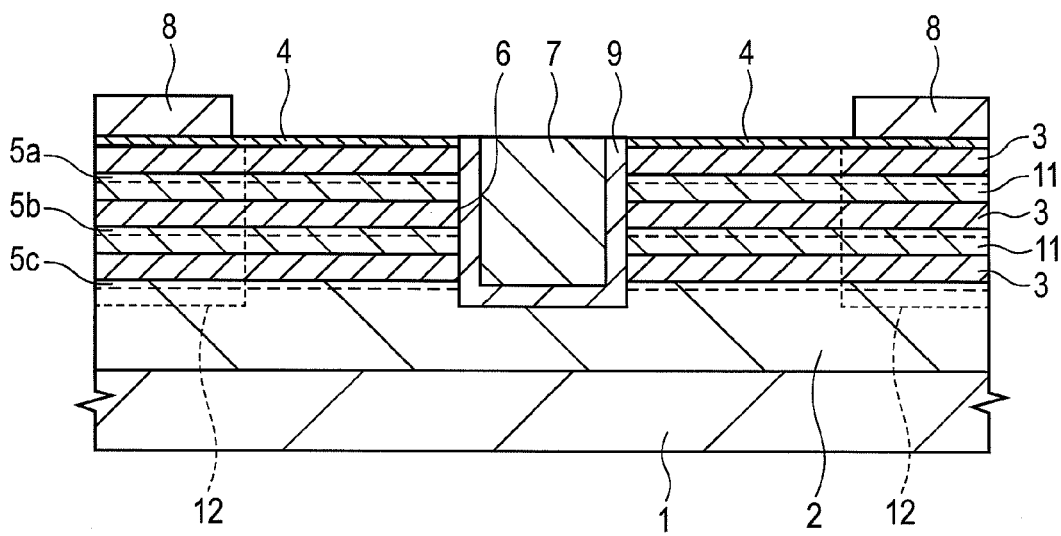
FIG. 2 is a cross section of a nitride semiconductor diode according to a second embodiment of the present invention.
Figure 3:
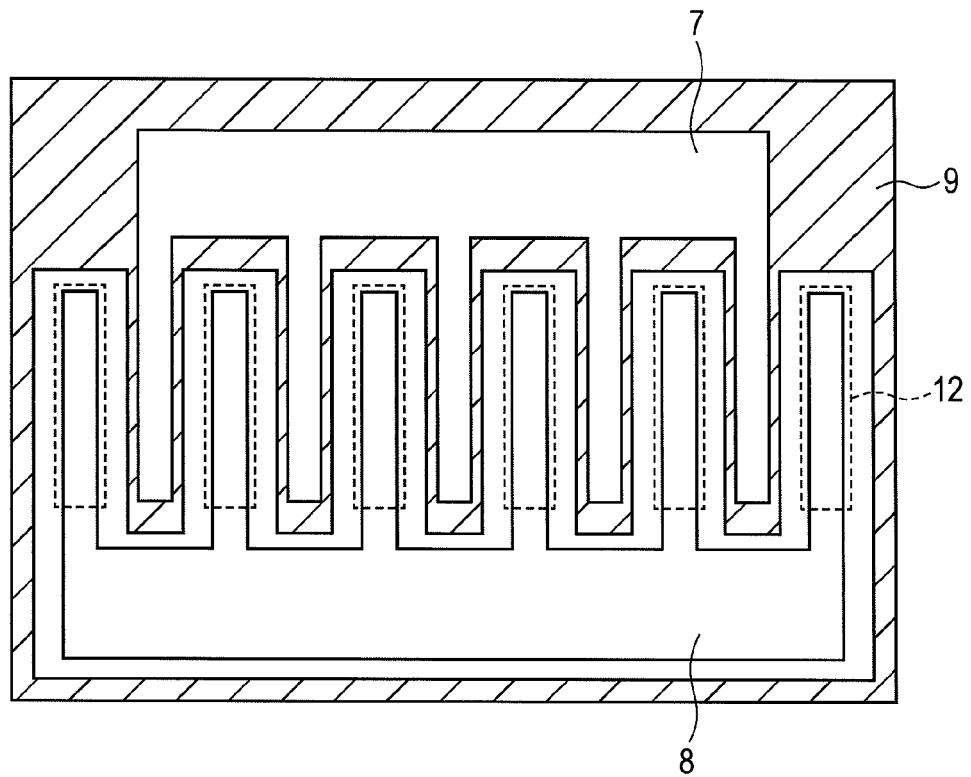
FIG. 3 is a plane view of the nitride semiconductor diode according to the second embodiment of the present invention.

A nitride semiconductor diode according to a second embodiment of the present invention is described below. FIGS. 2 and 3 are a cross section and a plane view of the nitride semiconductor diode according to the present embodiment respectively.

As is the case with the nitride semiconductor diode described in the first embodiment, the nitride semiconductor diode according to the present embodiment is of a horizontal diode in which an anode electrode formation region is subjected to dry etching using chlorine gas to form a recessed portion and the number of hetero junctions composed of an AlGaN layer and the stacked layer of GaN layer underlying the AlGaN layer is taken as three, thereby three conductive layers made of the two-dimensional electron gas are provided.

Thereby, current density in the forward direction characteristic is greater than the case where the conductive layer is a single as shown in FIG. 1, and the sheet resistance of the conductive layer is also decreased to allow decreasing on-resistance and on-voltage.

As shown in FIG. 2, the epitaxial layer forming the nitride semiconductor diode according to the present embodiment includes a high-resistance buffer layer 2 formed on a substrate 1 of sapphire, a barrier layer 3, an intermediate GaN layer 11, and a cap layer 4. The high-resistance buffer layer 2 is made of a 3.0 μm thick GaN layer into which carbon (C) with a density of $2.0\times10^{16}$ $cm^{-3}$ to $4.0\times10^{16}$ $cm^{-3}$ is doped (introduced). The barrier layer 3 is made of a 20 nm thick AlGaN layer into which carbon (C) with a density of $2.0\times10^{16}$ $cm^{-3}$ to $4.0\times10^{16}$ $cm^{-3}$ is doped. The intermediate GaN layer 11 is made of a 100 nm thick GaN layer into which carbon (C) with a density of $2.0\times10^{16}$ $cm^{-3}$ to $4.0\times10^{16}$ $cm^{-3}$ is doped. The cap layer 4 is made of a 5 nm thick GaN layer into which carbon (C) with a density of $2.0\times10^{16}$ $cm^{-3}$ to $4.0\times10^{16}$ $cm^{-3}$ is doped.

The high-resistance buffer layer 2, the barrier layer 3, the intermediate GaN layer 11, and the cap layer 4 are epitaxial layers. The barrier layer 3 is formed on the high-resistance buffer layer 2. The intermediate GaN layer 11 and the barrier layer 3 are alternately stacked on the barrier layer 3 one on, top of the other. In other words, the stacked film including the high-resistance buffer layer 2, the barrier layer 3, and the intermediate GaN layer 11 has a structure in which a plurality of heterojunction layers made of the GaN layer (the high-resistance buffer layer 2 or the intermediate GaN layer 11) and the Schottky-connected AlGaN layer (the barrier layer 3) thereon.

Conductive layers 5a, 5b, and 5c which are made of the two-dimensional electron gas are formed along the heterojunction interface, i.e., the interface between the GaN layer and the AlGaN layer thereon in the vicinity of the upper surface in the GaN layer (the high-resistance buffer layer 2 or the intermediate GaN layer 11) underlying the heterojunction interface. The conductive layer 5a made of the two-dimensional electron gas is formed on the upper surface of the intermediate GaN layer 11 formed on the topmost layer out of the three stacked heterojunctions. The conductive layer 5b is formed on the upper surface of the intermediate GaN layer 11 of the heterojunction just beneath the abovementioned heterojunction. The conductive layer 5c is formed on the upper surface of the high-resistance buffer layer 2 of the heterojunction just beneath the abovementioned heterojunction.

In other words, the stacked layer has such a structure that the high-resistance buffer layer 2 with the conductive layer 5c on the upper surface thereof, the barrier layer 3, the intermediate GaN layer 11 with the conductive layer 5b on the upper surface thereof, the barrier layer 3, the intermediate GaN layer 11 with the conductive layer 5a on the upper surface thereof, the barrier layer 3, and the cap layer 4 are formed on the substrate in this order. In FIG. 2, the contours of bottoms of the conductive layers 5a to 5c are shown using broken lines. More specifically, the conductive layers 5a to 5c are formed in the region between the upper surface of the high-resistance buffer layer 2 or the intermediate GaN layer 11 and the lower broken line.

Since carbon (C) is previously added to the epitaxial layer of the horizontal diode according to the present embodiment, there is brought about an effect that the intrinsic degree of each semiconductor layer is improved to further reduce parasitic leak current than the case undoped.

A recessed portion 6 with an etching depth of 250 nm which is formed by the dry etching using chlorine gas is provided in the region where an anode electrode 7 is formed. A 50 nm thick re-growth layer 9 made of GaN to which carbon (C) with a density of $8 \times 10^{17}$ cm$^{-3}$ is provided on the bottom surface and the inner wall of the recessed portion 6.

The anode (Schottky) electrode 7 made of Ni/Au is formed on the re-growth layer 9 in the recessed portion 6.

An n-type layer 12 into which silicon (Si) is ion implanted is provided in the stacked layer composed of the high-resistance buffer layer 2 in the region where the cathode electrode 8 is formed, the barrier layer 3, the intermediate GaN layer 11, and the cap layer 4. The cathode electrode 8 is provided immediately above the n-type layer 12. The n-type layer 12 is provided to allow sufficiently lowering the junction resistance between the cathode electrode 8 and the conductive layers 5a to 5c. In other words, the cathode electrode 8 is electrically connected with the side face of the stacked film including the conductive layers 5a to 5c via the n-type layer 12. In FIG. 12, the contour of the n-type layer 12 is indicated by a dotted line. The n-type layer 12 is formed on the upper surface of the stacked film in the region which is enclosed by the dotted line and is immediately under the cathode electrode 8. In FIG. 3, the contour of the n-type layer 12 is indicated by a broken line.

FIG. 3 shows a plane view of the nitride semiconductor diode according to the present embodiment. As shown in FIG. 3, the anode (Schottky) electrode 7 and the cathode (ohmic) electrode 8, which are comb-shaped, oppose with each other and the separation length (drift-layer length) between the anode electrode 7 and the cathode electrode 8 is 100 μm.

Each of the longitudinal lengths of comb portions of the anode electrode 7 and the cathode electrode 8 is 500 μm. Each of the widths of electrodes orthogonal to the longitudinal direction is 100 μl.

The number of comb teeth of the anode electrode 7 is five. The cathode electrode 8 is provided in opposition to the left and the right electrode end of the anode electrode 7, so that total opposition length between the electrodes is 0.5 mm×2 planes×5 comb teeth=5 mm.

The reverse-direction withstand voltage characteristic of the horizontal diode being the nitride semiconductor diode according to the first embodiment reflected the action and the effect of the present embodiment, the horizontal diode was not broken down even when a reverse voltage of 3 kV is applied thereto, and the reverse leak-current was as low as $1.0 \times 10^{-7}$ A/mm while the horizontal diode has three-layered conductive layers 5a to 5c.

This seems to be the effect brought about by the improvement of intrinsic degree of each semiconductor layer by previously adding carbon (C) to the epitaxial layer as described above. Also in the forward direction characteristic, an on-resistance showed a good value of 80 mΩcm$^3$ or less due to the effect of three-layered conductive layers.

Although carbon (C) was selected as an impurity to be added to the re-growth layer, as described above, it is needless to say that the similar effect can be obtained even if iron (Fe) or magnesium (Mg) is used.

Although the example was described in which carbon (C) was previously added to the epitaxial layer, this aims to previously improve the intrinsic degree of the epitaxial layer or increase the resistance of the epitaxial layer to eliminate parasitic leak components of the epitaxial layer, so that it is needless to say that the similar effect cab be obtained even if iron (Fe) as well as carbon (C) is added thereto.

Although, as the number of the conductive layers, i.e., three-layered heterojunctions were used, the number of stacked layers of AlGaN/GaN is changed to allow a larger number of conductive layers to be provided.

The thickness of a stackable barrier layer is limited depending on the magnitude of difference in lattice mismatch between a semiconductor material used in a barrier layer (AlGaN, for example) high in band gap energy and a semiconductor material low in band gap energy of which the conductive layer made of the two-dimensional electron gas is formed, so that the composition of each semiconductor material needs to be adjusted in consideration of the difference in lattice mismatch to provide a larger number of conductive layers.

Although the example was described in which the n-type layer is formed by ion implanting Si to ensure the ohmic connection of the cathode electrode, it is to be understood that the recessed portion is formed and then the cathode electrode may be formed on the side face of the recessed portion. Alternatively, the cathode electrode may be formed by combining both, that is, the recessed portion is formed in the region where the cathode electrode is formed and then Si ion is implanted into the bottom surface and the inner wall of the recessed portion to form the n-type layer on the whole surface of the recessed portion. This is because the characteristic required for the cathode electrode is a low ohmic contact with the conductive layer.

The production process of the principal portions of the nitride semiconductor diode according to the present embodiment is described below with reference to FIGS. 4 to 7. In FIGS. 4 to 7, the contours of the n-type impurity diffusion region and the conductive layers 5a to 5c are indicated by a dotted line and a broken line respectively.

Figure 4:
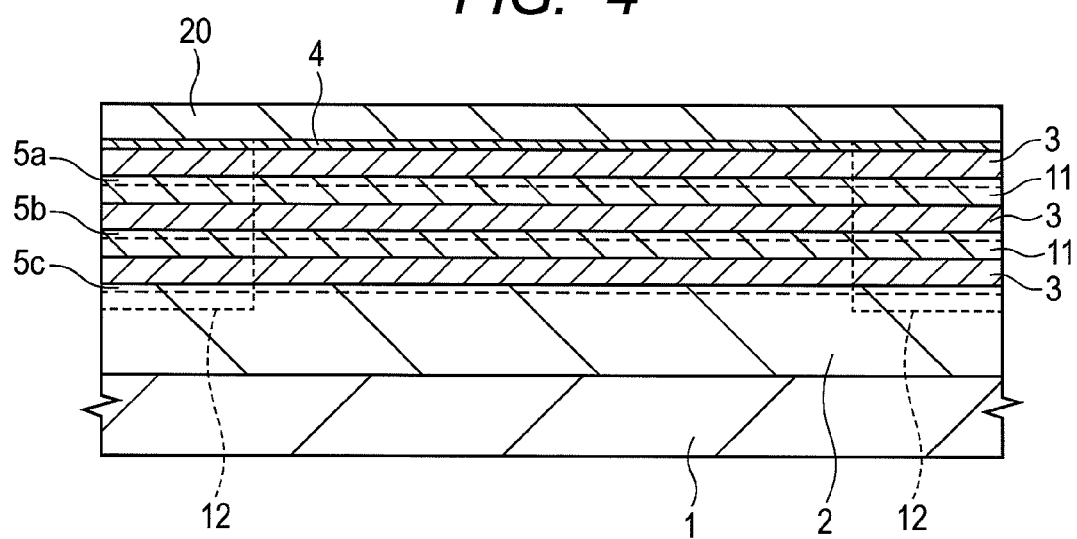
FIG. 4 is a cross section showing the production process of the nitride semiconductor diode according to the second embodiment of the present invention.

As shown in FIG. 4, the high-resistance buffer layer 2, the barrier layer 3, the intermediate GaN layer 11, the barrier layer 3, the intermediate GaN layer 11, the barrier layer 3, and the cap layer 4 are epitaxially grown on the substrate 1 of sapphire in this order. A 30 nm thick through-film of SiN (not shown) is deposited on the entire surface of the cap layer 4 and then a photo resist pattern in which a cathode electrode formation region is opened is formed. Si ion being an n-type impurity is implanted into the epitaxial layer in the opened region, the photo resist pattern and the through film are removed and then a cap film 20 made of 50 nm thick SiN is deposited on the entire surface of the epitaxial layer. Activation annealing is performed at a temperature of 1100° C. in a nitrogen atmosphere for 30 minutes to form an n-type layer 12.

Figure 5:
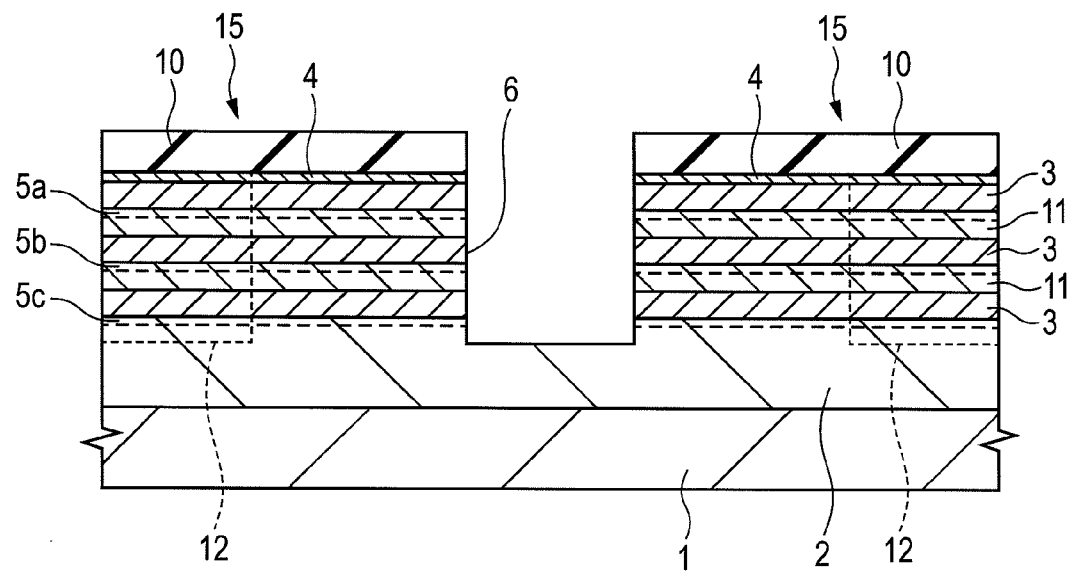
FIG. 5 is a cross section of the nitride semiconductor diode in a production process following FIG. 4.

As shown in FIG. 5, the cap film 20 is removed, a 300 nm thick SiO$_2$ film 10 is deposited on the entire surface of the epitaxial layer, and then the photo resist pattern in which the region where the n-type layer is formed and the entire region excluding a drift layer are opened is formed on the SiO$_2$ film 10. The SiO$_2$ film 10 beneath the region where the photo resist pattern is opened is removed by wet etching using fluorine solution to remove unneeded SiO$_2$ film 10. Etching the surface of the stacked film composed of the high-resistance buffer layer 2, the barrier layer 3, and the cap layer 4 with a depth of 250 nm by dry etching using chlorine gas forms the recessed portion 6. This produces a raised portion 15 of which the upper surface is higher in the bottom surface of the recessed portion 6 in the drift layer and the cathode electrode formation region.

Figure 6:
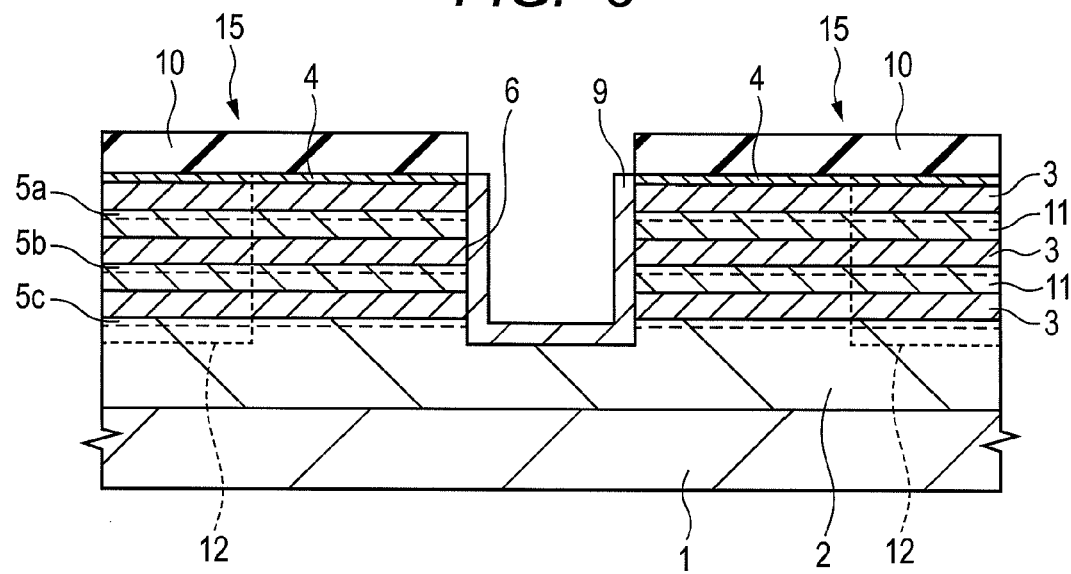
FIG. 6 is a cross section of the nitride semiconductor diode in a production process following FIG. 5.

As shown in FIG. 6, a re-growth layer 9 made of GaN to which carbon (C) with a density of $8 \times 10^{17}$ cm$^{-3}$ is added is formed by the metal-organic vapor phase epitaxy (MOVPE) method. The re-growth layer 9 is 50 nm in thickness. There-growth layer 9 is not grown on the SiO$_2$ film 10 but selectively grown and formed only on the bottom surface and the inner wall of the recessed portion 6.

Figure 7:
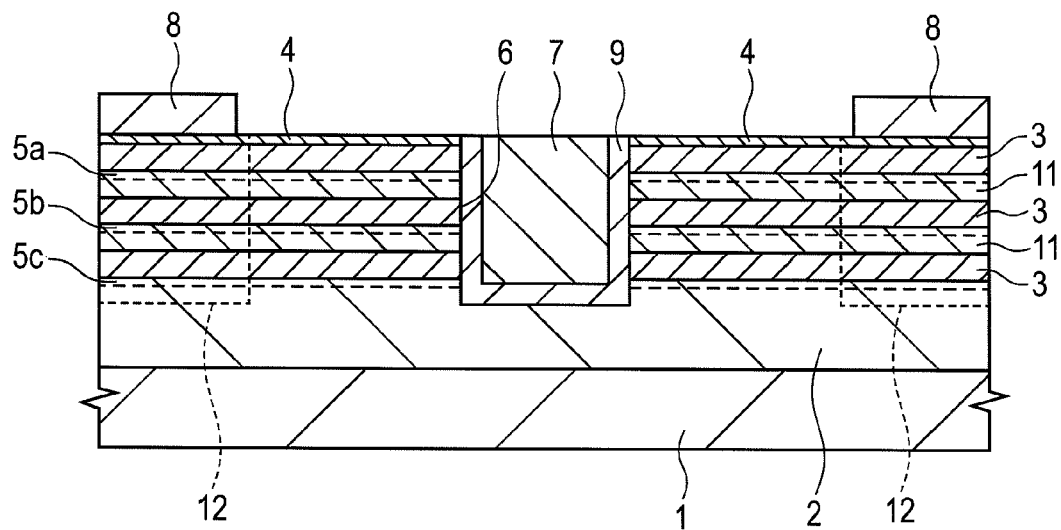
FIG. 7 is a cross section of the nitride semiconductor diode in a production process following FIG. 6.

As shown in FIG. 7, the SiO$_2$ film 10 is removed, the anode electrode 7 of Ni/Au is formed in the recessed portion 6 in which re-growth layer 9 is formed to be completely buried therein, and then the cathode electrode 8 of Ti/Al is formed on the region where the n-type layer 12 is provided. The cathode electrode 8 can be formed immediately above the n-type layer 12 such that metal film of Ti/Al is formed on the entire surface of the substrate 1, for example and then the metal film is patterned using a photo-lithography technique and the dry etching method. The above process completes the nitride semiconductor diode according to the present embodiment.

In the present embodiment, when the anode electrode connected by the Schottky junction with at least the side face of the recessed portion provided by processing and removing the nitride semiconductor stacked film with heterojunction by dry etching is formed, a semiconductor layer to which an impurity is added and which is high in resistance and significantly low in conductivity is re-grown on the surface of the nitride semiconductor exposed in the recessed portion before the anode electrode is formed to allow inhibiting an increase in leak current from the anode electrode and improving withstand voltage.

Third Embodiment

Figure 8:
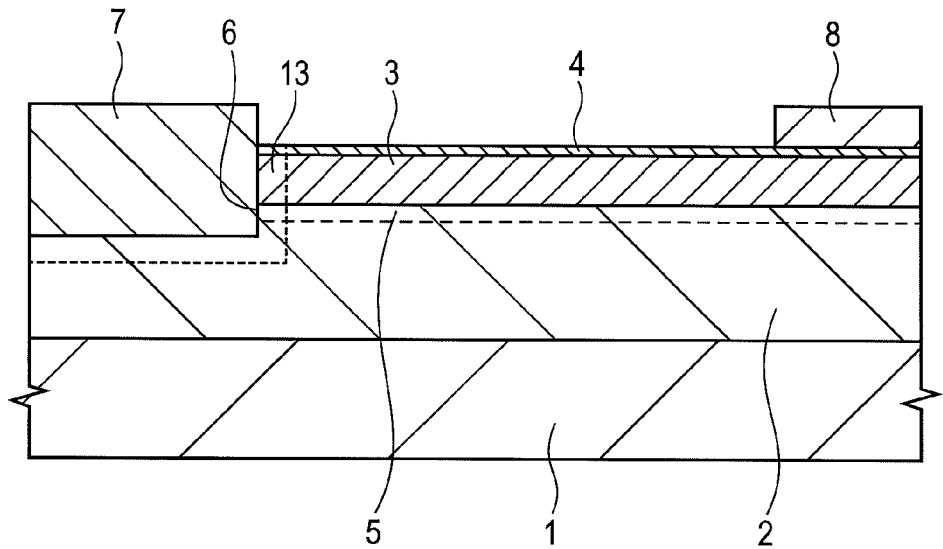
FIG. 8 is a cross section showing the nitride semiconductor diode being a third embodiment of the present invention.

A nitride semiconductor diode according to a third embodiment of the present invention is described below. FIG. 8 is a cross section of the nitride semiconductor diode according to the present embodiment.

The following describes a structure in which the reverse-direction characteristic of the nitride semiconductor diode is improved by producing the nitride semiconductor diode with n-type impurity diffused on the surface of the nitride semiconductor in the recessed portion in the anode electrode formation region, which is decreased in resistance by the dry etching, without providing the re-growth layer described in the first and second embodiments. The p-type impurity diffused from the inner wall and the bottom surface of the recessed portion to the stacked film made of the epitaxial layer is preferably zinc (Zn) or magnesium (Mg) in terms of easiness of process.

In introducing Zn and Mg, an oxide film of ZnO or MgO is directly deposited on a desired region on the nitride semiconductor subjected to diffusion and then heat treatment is performed at a temperature of at least 600° C. or higher to allow easily diffusing Zn and Mg into the stacked film of the nitride semiconductor.

The nitride semiconductor diode according to the present embodiment uses a substrate with the epitaxial structure similar to the one described in the first and second embodiments for the sake of easy comparison with the nitride semiconductor diode of the comparison example. As shown in FIG. 8, the structure of the semiconductor element is such that a p-type impurity diffusion region 13 into which Zn as a p-type impurity is diffused is provided on the bottom surface and the side face of the recessed portion 6 provided in the formation region of the anode electrode 7 characterized by the present invention. In other words, the structure of the nitride semiconductor diode according to the present embodiment is similar to that shown in FIG. 1, however, the re-growth layer 9 is not provided in the present embodiment, so that the present embodiment is different from the first and second embodiments in that a p-type impurity diffusion region 13 is formed on from the inner wall and the bottom surface of the recessed portion 6 to the inside of the stacked film in the vicinity of the recessed portion 6.

As shown in FIG. 8, the contour of the bottom portion of the conductive layer 5 is indicated by a broken line and the contour of the p-type impurity diffusion region 13 is indicated by a dotted line. In other words, the p-type impurity diffusion region 13 is formed on, from the surface of the recessed portion 6 to the dotted line.

In the process for forming the p-type impurity diffusion region 13, the recessed portion 6 is formed in the anode electrode formation region by the dry etching using chlorine gas with the SiO$_2$ film pattern formed on the stacked film as a mask and a ZnO film is deposited and formed on the entire face of the substrate using a spattering method without removing the SiO$_2$ film. The ZnO film is 100 nm in thickness. Thereafter, heat treatment is performed at a temperature of 800° C. for one hour in a nitrogen atmosphere to diffuse Zn into the bottom surface and the side face of the recessed portion 6, forming the p-type impurity diffusion region 13.

The unneeded ZnO film and SiO$_2$ film patterns are removed using acid and alkaline etching solution, the anode electrode 7 is formed inside the recessed portion 6, and the cathode electrode 8 is formed in a predetermined region opposing the anode electrode 7 via the stacked film to complete the horizontal nitride semiconductor diode according to the present embodiment.

The dimension and arrangement of the anode and cathode electrodes 7 and 8 and a distance between the electrodes are similar to those described using FIG. 13. Also in the present embodiment, as shown in FIG. 8, the cathode electrode 8 is formed not on the inner wall but on the plane of the upper surface of the stacked film as is the case with the first and second embodiments.

For the purpose of investing Zn density profile in the nitride semiconductor due to the diffusion of Zn, the inventors separately prepared a sapphire substrate on which 4 μm thick undoped GaN layer was epitaxially grown, the ZnO film is deposited and formed on the undoped GaN layer in the same condition as the above using the spattering method and heat treatment was performed at a temperature of 800° C. for one hour in a nitrogen atmosphere same as the above.

Figure 9:
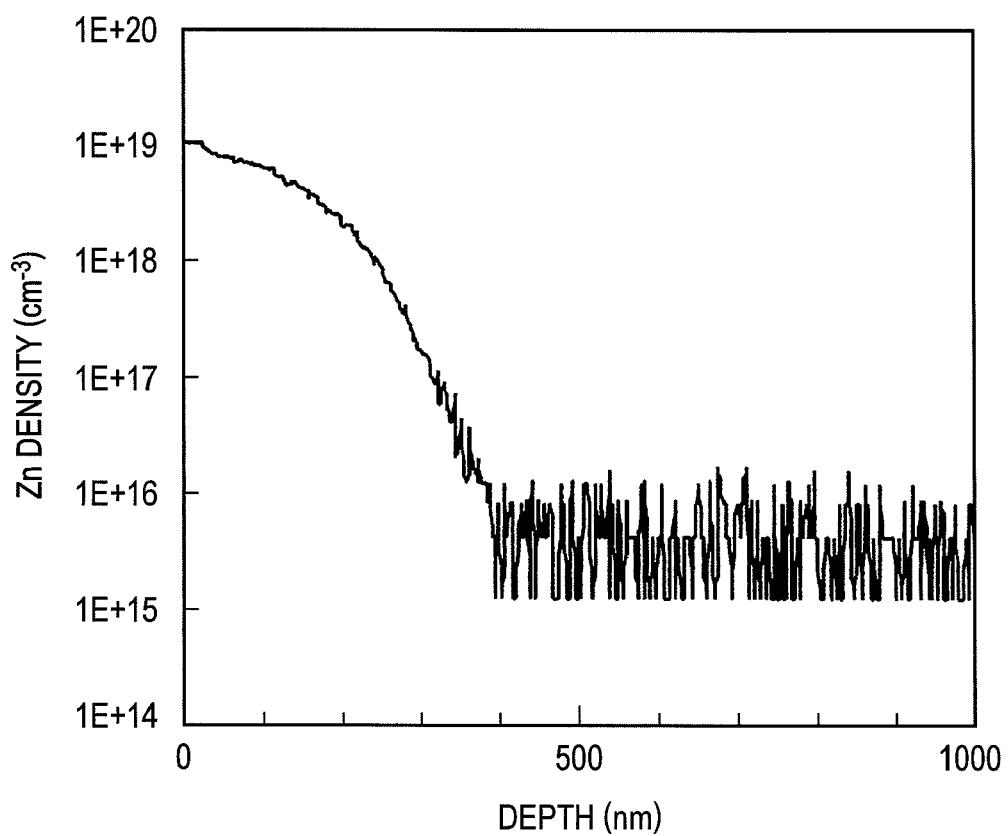
FIG. 9 is a graph showing the density distribution of Zn in depth direction in GaN.

After that, the unneeded ZnO film was removed and the Zn density profile in the depth direction in the GaN was examined. The results of the examination are shown in FIG. 9. In the graph showing a density distribution in FIG. 9, the abscissa indicates depth from the semiconductor surface and the ordinate indicates the density of zinc (Zn).

From the density distribution shown in FIG. 9, it can be seen that the density of Zn is highest in the vicinity of the top surface of the undoped GaN layer and the density is about $1.0 \times 10^{19}$ cm$^{-3}$. The density distribution also shows that a Zn diffusion depth extends to about 400 nm and the density of Zn indicates a tendency to exponentially decrease to the depth direction due to diffusion from the surface.

In view of the principle of impurity diffusion itself, it is estimated that the impurity density profile due to the diffusion shows the similar tendency not only on the upper surface, but also in the direction of side face of nitride semiconductor exposed by the dry etching, so that it is estimated that the density profile reflects the Zn density in the direction of side face of the recessed portion 6 on which the anode electrode 7 is formed.

As a result of evaluating the reverse-direction characteristic of the horizontal diode according to the present invention, the horizontal diode was not broken down, as is the case with the planer structure diode, even if a reverse voltage of up to 1 kV was applied thereto. This is probably because carriers on the surface of the semiconductor occurring by the influence of the etching are compensated by p-type impurities such as Zn to cause the carriers to disappear.

The impurity to be implanted at this point should not be an n-type conductivity impurity.

Excessively implanting a p-type impurity forms a diode by a pn-junction between the anode and cathode electrodes in the stacked film, so that it is desirable that an impurity to be implanted is a p-type impurity having a sufficiently low density.

FIG. 10 shows the effect of diffusion of impurities using ZnO film and MgO film and results of investigation on the reverse-direction characteristic in the horizontal diode with respect to each impurity diffusion condition.

Both of the ZnO film and the MgO film are 100 nm in thickness. Heat treatment time period is one hour. For a parameter of a heat treatment condition, temperature is 600° C., 700° C., and 800° C. Heat-treatment atmosphere includes normal-pressure nitride atmosphere and reduced pressure (100 Pa). Breakdown voltage (1 kV at maximum) and a reverse leak current are shown in FIG. 10 as the reverse-direction characteristic of the diode.

As shown in FIG. 10, the horizontal diode is 1 kV or higher in breakdown voltage under any condition or shows that it has a high withstand-voltage characteristic. However, a difference appears in a reverse leak current depending upon heat treatment atmosphere.

When reverse leak currents in the normal-pressure nitride atmosphere and under the reduced pressure (100 Pa) are compared with each other, the leak current under the reduced pressure tends to be smaller. Furthermore, the lower the heat treatment temperature, the smaller the leak current tends to be.

As a result of examining an impurity profile in the nitride semiconductor, as is the same with the above, about the ZnO film and the MgO film using 600 heat treatment condition under the reduced pressure under which the leak current is the smallest, the maximum impurity density of zinc (Zn) was $6.2 \times 10^{17}$ cm$^{-3}$. The maximum impurity density of magnesium (Mg) was $4.7 \times 10^{17}$ cm$^{-3}$.

As a result of the examination, the inventors found that the diffusion of the p-type impurity into the recessed portion of the anode electrode formation region provided by the dry etching allowed showing the tendency of the reverse leak current equivalent to that of the planer structure and increasing the breakdown voltage. At this point, the p-type impurity density is desirably at least $5 \times 10^{17}$ cm$^{-3}$ or more in view of the above context.

The nitride semiconductor never shows the p conductive type by merely diffusing the p-type impurity into the nitride semiconductor in the above heat-treatment temperature range and the region where the p-type impurity is simply diffused increases resistance. This is also clear from the fact that, as far as the forward direction characteristic of the diode produced in the present embodiment was evaluated, a rising voltage in the forward direction was approximately one volt and did not reach a band gap energy (of about 3.3 V).

For this reason, the junction between the region where the p-type impurity is diffused and the anode electrode is not a pn junction but a Schottky junction. All the horizontal diodes produced by applying the p-type impurity diffusion are Schottky barrier diodes.

In the present embodiment, there is descried the example in which the present embodiment is applied to the horizontal diode with a single conductive layer. As described in the second embodiment, it is to be understood that the effect of the present invention can be obtained even if the present embodiment is applied to the horizontal diode with a plurality of conductive layers.

In the present embodiment, when the anode electrode connected by the Schottky junction with at least the side face of the recessed portion provided by processing and removing the nitride semiconductor stacked film with heterojunction by dry etching is formed, an impurity is diffused into the surface of the nitride semiconductor exposed in the recessed portion before the anode electrode is formed to allow inhibiting an increase in leak current from the anode electrode and improving withstand voltage.

The invention made by the inventors is described in detail above based on the embodiments. The present invention is not limited to the embodiments, but it is to be understood that various changes may be made without departing from the gist of the present invention.

Although the example using sapphire substrate, for example, was described in the first to third embodiments, a SiC substrate, a Si substrate, or a GaN substrate may be used in addition to the sapphire substrate.

In the first and third embodiments, there was described the case where the first and second nitride semiconductor layers epitaxially grown on the substrate were un-doped, however, as is the case with the second embodiment, carbon (C) or iron (Fe) may be previously and moderately doped into the epitaxial layer. This makes the intrinsic degree of the first and second nitride semiconductor layers higher than the un-doped semiconductor layers to allow further decreasing the parasitic reverse leak current level of the epitaxial layer itself.

The present invention is effectively applicable to the production technique of the horizontal Schottky barrier diode.

What is claimed is:

1. A nitride semiconductor diode comprising:
   a substrate;
   a heterojunction stacked film on which a first nitride semiconductor layer formed on the substrate and a second nitride semiconductor layer greater in band gap energy than the first nitride semiconductor layer are stacked;
   a cathode electrode ohmically connected with the side face of the stacked film; and
   an anode electrode,
   wherein the stacked film is provided with a recessed portion which reaches the depth of a heterojunction surface being the interface of the first and second nitride semiconductor layers,
   wherein the recessed portion is provided with a region where at least one type of impurity selected from among a group of carbon (C), iron (Fe), zinc (Zn), and magnesium (Mg) is implanted, and
   wherein the anode electrode contacts the region and is schottky connected with the stacked film.

2. The nitride semiconductor diode according to claim 1, wherein the region is formed by implanting the impurity into the stacked film itself or forming a film including the impurity.

3. The nitride semiconductor diode according to claim 1, wherein the region includes C or Fe with a density of $4 \times 10^{16}$ cm$^{-3}$ or more or Mg with a density of $1 \times 10^{17}$ cm$^{-3}$ or more.

4. The nitride semiconductor diode according to claim 1, wherein the density of the impurity in the region is higher than that of the impurity in the stacked film of the interface between the cathode electrode and the stacked film.

5. The nitride semiconductor diode according to claim 1, wherein the first nitride semiconductor layer includes GaN, and wherein the second nitride semiconductor layer includes AlGaN, InAlN, or InAlGaN.

6. The nitride semiconductor diode according to claim 1, wherein Si is implanted into the stacked film adjacent to the cathode electrode.

7. The nitride semiconductor diode according to claim 1, wherein the substrate includes sapphire, Si, SiC, or GaN.

8. The nitride semiconductor diode according to claim 1, wherein a cap layer including GaN is formed on the second nitride semiconductor layer formed on the topmost layer of the stacked film.

9. The nitride semiconductor diode according to claim 1, wherein the region includes GaN, AlGaN, InGaN, InAlN or InAlGaN.

10. The nitride semiconductor diode according to claim 1, wherein C or Fe is implanted into the first and second nitride semiconductor layers.

* * * * *